United States Patent
Vasquez et al.

(10) Patent No.: US 11,283,010 B2
(45) Date of Patent: *Mar. 22, 2022

(54) PRECESSIONAL SPIN CURRENT STRUCTURE FOR MAGNETIC RANDOM ACCESS MEMORY WITH NOVEL CAPPING MATERIALS

(71) Applicant: Integrated Silicon Solution, (Cayman) Inc., Grand Cayman (KY)

(72) Inventors: Jorge Vasquez, San Jose, CA (US); Bartlomiej Adam Kardasz, Pleasanton, CA (US); Cheng Wei Chiu, Dublin, CA (US); Mustafa Pinarbasi, Morgan Hill, CA (US)

(73) Assignee: Integrated Silicon Solution, (Cayman) Inc., Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 16/124,655

(22) Filed: Sep. 7, 2018

(65) Prior Publication Data

US 2020/0083442 A1  Mar. 12, 2020

(51) Int. Cl.
| | |
|---|---|
| *H01L 43/10* | (2006.01) |
| *H01L 43/02* | (2006.01) |
| *H01L 27/22* | (2006.01) |
| *G11C 11/16* | (2006.01) |
| *H01F 10/32* | (2006.01) |
| *H01L 43/08* | (2006.01) |

(52) U.S. Cl.
CPC ............ *H01L 43/10* (2013.01); *G11C 11/161* (2013.01); *H01F 10/329* (2013.01); *H01F 10/3254* (2013.01); *H01L 27/222* (2013.01); *H01L 43/02* (2013.01); *H01L 43/08* (2013.01)

(58) Field of Classification Search
CPC ....................................................... H01F 10/329
See application file for complete search history.

(56) References Cited

U.S. PATENT DOCUMENTS

| | | | |
|---|---|---|---|
| 10,141,499 B1 * | 11/2018 | Schabes | H01F 10/3272 |
| 10,229,724 B1 * | 3/2019 | El Baraji | H01F 10/3286 |
| 10,236,047 B1 * | 3/2019 | Ryan | G11C 11/1675 |
| 10,236,048 B1 * | 3/2019 | Tzoufras | H01L 43/08 |
| 10,236,439 B1 * | 3/2019 | Schabes | H01F 10/3254 |
| 10,255,962 B1 * | 4/2019 | El Baraji | H01F 10/3286 |
| 10,270,027 B1 * | 4/2019 | Gajek | H01L 43/08 |
| 10,319,900 B1 * | 6/2019 | Schabes | H01F 10/3286 |
| 10,339,993 B1 * | 7/2019 | Schabes | H01F 41/307 |

(Continued)

*Primary Examiner* — Victoria K. Hall

(57) ABSTRACT

A magnetic memory element having a magnetic free layer and a magnetic reference layer with a non-magnetic barrier layer between the magnetic reference layer and the magnetic free layer. A spin current layer (which may be a precessional spin current layer) is located adjacent to the magnetic free layer and is separated from the magnetic free layer by a non-magnetic coupling layer. A material layer adjacent to and in contact with the spin current layer, has a material composition and thickness that are chosen to provide a desired effective magnetization in the spin current layer. The material layer, which may be a capping layer or a seed layer, can be constructed of a material other than tantalum which may include one or more of Zr, Mo, Ru, Rh, Pd, Hf, W, Ir, Pt and/or alloys and/or nitrides of these elements.

9 Claims, 3 Drawing Sheets

(56) References Cited

U.S. PATENT DOCUMENTS

| | | | | |
|---|---|---|---|---|
| 10,361,359 B1* | 7/2019 | Schabes | ........... | H01L 43/08 |
| 10,367,136 B2* | 7/2019 | Kardasz | ........... | H01F 10/3286 |
| 10,374,147 B2* | 8/2019 | Pinarbasi | ........... | H01F 10/3254 |
| 10,388,800 B1* | 8/2019 | Sung | ........... | H01L 29/42392 |
| 10,388,860 B2* | 8/2019 | Dobisz | ........... | H01F 41/308 |
| 10,468,588 B2* | 11/2019 | Schabes | ........... | H01L 27/222 |
| 10,607,902 B2* | 3/2020 | Boone | ........... | H01L 22/34 |
| 10,651,370 B2* | 5/2020 | Pinarbasi | ........... | H01F 10/3286 |
| 10,665,777 B2* | 5/2020 | Kardasz | ........... | H01L 43/10 |
| 10,868,236 B2* | 12/2020 | Shrivastava | ........... | H01L 43/12 |
| 2011/0007560 A1* | 1/2011 | Dieny | ........... | G11C 11/161 |
| | | | | 365/171 |
| 2012/0063218 A1* | 3/2012 | Huai | ........... | G11C 11/16 |
| | | | | 365/171 |
| 2012/0280339 A1* | 11/2012 | Zhang | ........... | G11C 11/16 |
| | | | | 257/421 |
| 2013/0069185 A1* | 3/2013 | Saida | ........... | H01F 10/3286 |
| | | | | 257/422 |
| 2013/0134534 A1* | 5/2013 | Sbiaa | ........... | G11C 11/161 |
| | | | | 257/421 |
| 2013/0181305 A1* | 7/2013 | Nakayama | ........... | G11C 11/16 |
| | | | | 257/421 |
| 2014/0145792 A1* | 5/2014 | Wang | ........... | H01F 10/3272 |
| | | | | 331/94.1 |
| 2014/0269037 A1* | 9/2014 | Saida | ........... | H01L 43/02 |
| | | | | 365/158 |
| 2016/0372656 A1* | 12/2016 | Pinarbasi | ........... | H01L 43/02 |
| 2018/0248110 A1* | 8/2018 | Kardasz | ........... | H01L 43/10 |
| 2018/0248113 A1* | 8/2018 | Pinarbasi | ........... | H01L 43/08 |
| 2019/0013460 A1* | 1/2019 | Ikegawa | ........... | H01F 10/3286 |
| 2019/0288031 A1* | 9/2019 | Satoh | ........... | G11C 11/1659 |
| 2020/0005861 A1* | 1/2020 | O'Brien | ........... | H01F 10/329 |
| 2020/0411752 A1* | 12/2020 | Kardasz | ........... | H01L 43/12 |

* cited by examiner

PRECESSIONAL SPIN CURRENT STRUCTURE FOR MAGNETIC RANDOM ACCESS MEMORY WITH NOVEL CAPPING MATERIALS

FIELD OF THE INVENTION

The present invention relates to magnetic random access memory (MRAM) and more particularly to a magnetic memory element having a novel capping or seed layer structure for controlling magnetic precessional spin current magnetic moment.

BACKGROUND

Magnetic Random Access Memory (MRAM) is a non-volatile data memory technology that stores data using magnetoresistive cells such as Magnetoresistive Tunnel Junction (MTJ) cells. At their most basic level, such MTJ elements include first and second magnetic layers that are separated by a thin, non-magnetic layer such as a tunnel barrier layer, which can be constructed of a material such as Mg—O. The first magnetic layer, which can be referred to as a reference layer, has a magnetization that is fixed in a direction that is perpendicular to that plane of the layer. The second magnetic layer, which can be referred to as a magnetic free layer, has a magnetization that is free to move so that it can be oriented in either of two directions that are both generally perpendicular to the plane of the magnetic free layer. Therefore, the magnetization of the free layer can be either parallel with the magnetization of the reference layer or anti-parallel with the direction of the reference layer (i.e. opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest electrical resistance state. Conversely, when the magnetization of the magnetic free layer is in a direction that is opposite to that of the magnetic reference layer, the electrical resistance across the MTJ element is at its highest electrical resistance state.

The switching of the MTJ element between high and low resistance states results from electron spin transfer. An electron has a spin orientation. Generally, electrons flowing through a conductive material have random spin orientations with no net spin orientation. However, when electrons flow through a magnetized layer, the spin orientations of the electrons become aligned so that there is a net aligned orientation of electrons flowing through the magnetic layer, and the orientation of this alignment is dependent on the orientation of the magnetization of the magnetic layer through which they travel. When the orientations of the magnetizations of the free and reference layer are oriented in the same direction, the majority spin of the electrons in the free layer are is in the same direction as the orientation of the majority spin of the electrons in the reference layer. Because these electron spins are in generally the same direction, the electrons can pass relatively easily through the tunnel barrier layer. However, if the orientations of the magnetizations of the free and reference layers are opposite to one another, the spin of majority electrons in the free layer will be generally opposite to the majority spin of electrons in the reference layer. In this case, electrons cannot easily pass through the barrier layer, resulting in a higher electrical resistance through the MTJ stack.

Because the MTJ element can be switched between low and high electrical resistance states, it can be used as a memory element to store a bit of data. For example, the low resistance state can be read as an on or "1", whereas the high resistance state can be read as a "0". In addition, because the magnetic orientation of the magnetic free layer remains in its switched orientation without any electrical power to the element, it provides a robust, non-volatile data memory bit.

To write a bit of data to the MTJ cell, the magnetic orientation of the magnetic free layer can be switched from a first direction to a second direction that is 180 degrees from the first direction. This can be accomplished, for example, by applying a current through the MTJ element in a direction that is perpendicular to the planes of the layers of the MTJ element. An electrical current applied in one direction will switch the magnetization of the free layer to a first orientation, whereas switching the direction of the current and such that it is applied in a second direction will switch the magnetization of the free layer to a second, opposite orientation. Once the magnetization of the free layer has been switched by the current, the state of the MTJ element can be read by reading a voltage across the MTJ element, thereby determining whether the MTJ element is in a "1" or "0" bit state. Advantageously, once the switching electrical current has been removed, the magnetic state of the free layer will remain in the switched orientation until such time as another electrical current is applied to again switch the MTJ element. Therefore, the recorded data bit is non-volatile in that it remains intact in the absence of any electrical power.

SUMMARY

The present invention provides a magnetic memory element for use in a magnetic memory array. The magnetic memory element includes a magnetic tunnel junction structure (MTJ) that includes a magnetic free layer, a magnetic reference layer, and a non-magnetic barrier layer located between the magnetic free layer and the magnetic reference layer. The magnetic memory element also includes a spin current layer that is separated from the magnetic free layer by a coupling layer, and a material layer in contact with the magnetic spin current layer, the material layer being of a material composition and thickness that are chosen to provide a desired effective magnetization in the magnetic spin current layer.

The material layer that is in contact with the magnetic spin current layer can be a capping layer or a seed layer, depending upon the structure of the magnetic memory element. The magnetic free layer and magnetic reference layer can have a magnetic anisotropy that is perpendicular to the plane of the layers, and the magnetic spin current layer can have a magnetic anisotropy with a primary component that is oriented parallel with the plane of the magnetic spin current layer. The magnetic spin current layer can have a magnetization that is fixed in a direction that is primarily in the plane of the layer or can have a magnetization that moves in a precessional oscillation as a result of spin torque.

The material layer (which can be a capping layer or a seed layer) can be formed of a material other than Ta, such as transition metals. For example, the material layer can be constructed of one or more of Zr, Mo, Ru, Rh, Pd, Hf, W, Ir, Pt and/or alloys and/or nitrides of these elements.

The choice of material composition of the material layer in contact with the magnetic spin current layer can advantageously be used as an additional mechanism ("knob") for adjusting and tuning the effective magnetization of the magnetic spin current layer. Achieving optimal performance of the magnetic memory element requires a balancing between magnetic forces between the magnetic free layer and the magnetic spin coupling layer. While the thickness of the material layer can be used to adjust the effective magnetization of the spin current layer, the optimal thickness of the various layers of the magnetic memory element is dictated by other design requirements, such as the desire to minimize the overall height of the magnetic memory element structure. By providing an additional mechanism (other than height) for tuning the effective magnetization of the spin current layer, an optimal thickness of the layers can be maintained while also optimizing the effective magnetization of the spin current layer.

These and other features and advantages of the invention will be apparent upon reading of the following detailed description of the embodiments taken in conjunction with the figures in which like reference numeral indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION

The following description is of the best embodiments presently contemplated for carrying out this invention. This description is made for the purpose of illustrating the general principles of this invention and is not meant to limit the inventive concepts claimed herein.

Figure 1:
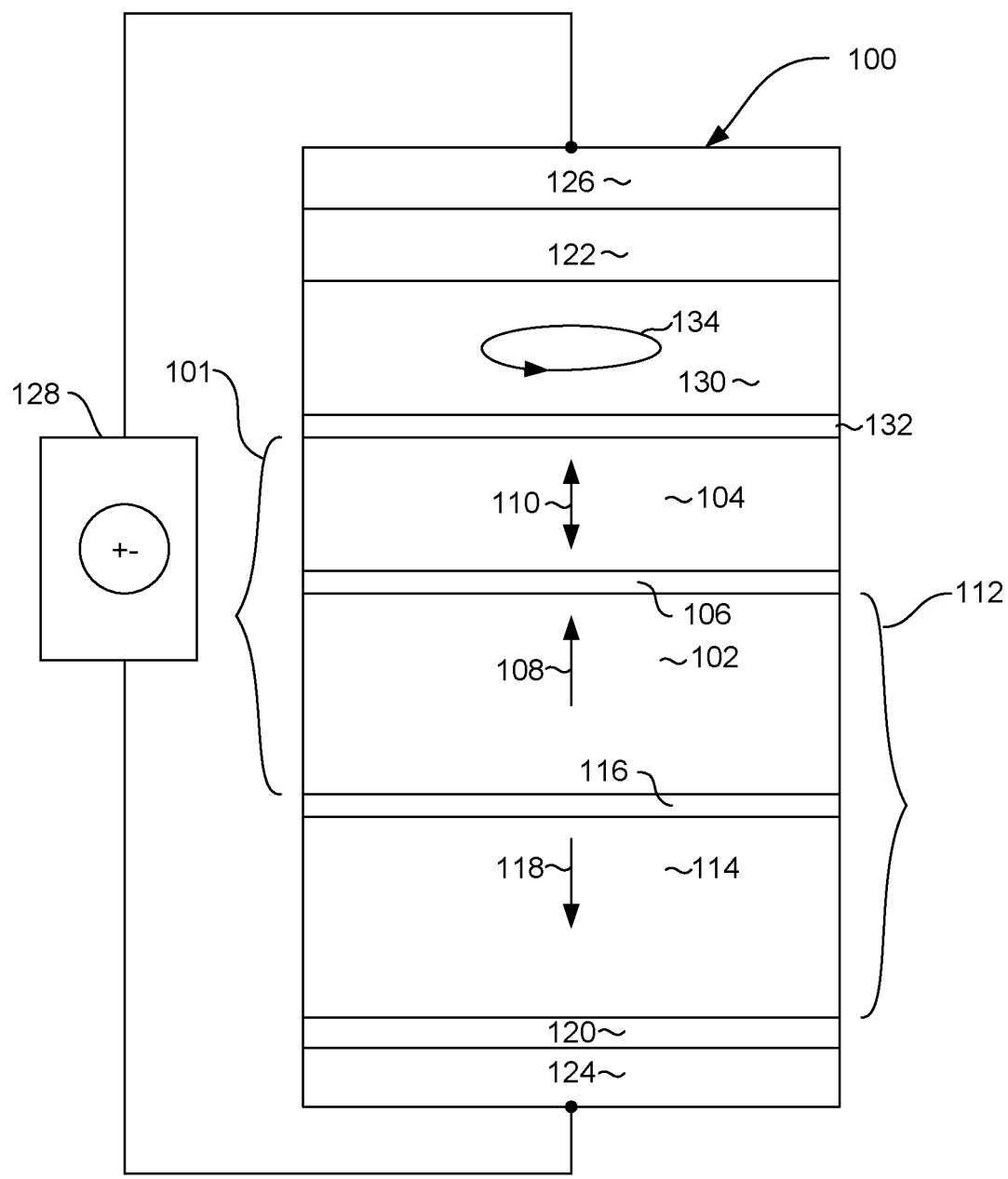
FIG. 1 is a schematic, cross sectional view of a perpendicular magnetic tunnel junction (pMTJ) element, such as might be used in an embodiment of the invention.

Referring now to FIG. 1, a magnetic memory element 100 can be in the form a of a perpendicular magnetic tunnel junction (pMTJ) memory element. The magnetic memory element can include an MTJ 101 that can include a magnetic reference layer 102, a magnetic free layer 104 and a thin, non-magnetic, electrically insulating magnetic barrier layer 106 located between the magnetic reference layer 102, and magnetic free layer 104. The barrier layer 106 can be an oxide such as MgO. The magnetic reference layer 102 has a magnetization 108 that is fixed in a direction that is preferably perpendicular to the plane of the layers as indicated by arrow 108. The magnetic free layer 104 has a magnetization 110 that can be in either of two directions perpendicular to the plane of the layer 104. While the magnetization 110 of the free layer remains in either of two directions perpendicular to the plane of the layer 104 in a quiescent state, it can be moved between these two directions as will be described in greater detail herein below. When the magnetization 110 of the magnetic free layer 104 is in the same direction as the magnetization 108 of the reference layer 102, the electrical resistance across the layers 102, 106, 104 is at a low resistance state. Conversely, when the magnetization 110 of the free layer 104 is opposite to the magnetization 108 of the reference layer 102, the electrical resistance across the layers 102, 106, 104 is in a high resistance state.

The magnetic reference layer 102 can be part of an anti-parallel magnetic pinning structure 112 that can include a magnetic keeper layer 114, and a non-magnetic, antiparallel coupling layer 116 located between the keeper layer 114 and reference layer 102. The antiparallel coupling layer 116 can be a material such as Ru and can be constructed to have a thickness such that it will ferromagnetically antiparallel couple the layers 114, 102. The antiparallel coupling between the layers 114, 102 pins the magnetization 108 of the reference layer 102 in a direction opposite to the direction of magnetization 118 of the keeper layer 114.

A seed layer 120 may be provided near the bottom of the memory element 100 to initiate a desired crystalline structure in the above deposited layers. In addition, a novel capping layer 122 is provided near the top of the memory element 100 to protect the underlying layers during manufacture, such as during high temperature annealing and from exposure to ambient atmosphere. The capping layer 122 has unique and novel properties to assist in free layer magnetization switching, which will be discussed in greater detail herein below. Also, electrodes 124, 126 may be provided at the top and bottom of the memory element 100. The electrodes 124, 126, which may be constructed of a non-magnetic, electrically conductive material such as Ta, W, Cu or Al, can provide electrical connection with circuitry 128 that can include a current source and can further include circuitry for reading an electrical resistance across the memory element 100.

The magnetic free layer 104 has a perpendicular magnetic anisotropy that causes the magnetization 110 of the free layer 104 to remain stable in one of two directions perpendicular to the plane of the free layer 104. In a write mode, the orientation of the magnetization 110 of the free layer 104 can be switched between these two directions by applying an electrical current through the memory element 100 from the circuitry 128. A current in one direction will cause the memory element to flip to a first orientation, and a current in an opposite direction will cause the magnetization to flip to a second, opposite direction. For example, if the magnetization 110 is initially oriented in a downward direction in FIG. 1, applying a current in a downward direction through the element 100 will cause electrons to flow in an opposite direction upward through the element 100. The electrons travelling through the reference layer will become spin polarized as a result of the magnetization 108 of the reference layer 102. These spin polarized electrons cause a spin torque on the magnetization 110 of the free layer 104, which causes the magnetization to flip directions.

On the other hand, if the magnetization 110 of the free layer 104 is initially in an upward direction in FIG. 1, applying an electrical current through the element 100 in an upward direction will cause electrons to flow in an opposite direction, downward through the element 100. However, because the magnetization 110 of the free layer 104 is opposite to the magnetization 108 of the reference layer 102, the electrons with an opposite spin will not be able to pass through the barrier layer 106 to the reference layer 102. As a result, the electrons having an opposite spin will accumulate at the junction between the free layer 104 and barrier layer 106. This accumulation of spin polarized electrons causes a spin torque that causes the magnetization 110 of the free layer 104 to flip from a downward direction to an upward direction.

In order to assist the switching of the magnetization 110 of the free layer 104, the memory element 100 includes a precessional spin current (PSC) layer 130 formed above the free layer 104. The PSC layer can be separated from the free layer 104 by a coupling layer 132. The coupling layer 132 can be a material such as Magnesium Oxide (MgO) and can have a thickness of about 1 nm, or more preferably 0.3 to 1.5 nm. The PSC layer 130 has a magnetic anisotropy that causes it to have a magnetization 134 with a primary component oriented in the in-plane direction (e.g. orthogonal or nearly orthogonal to the magnetizations 110, 108 of the free and reference layers 104, 102. The magnetization 134, of the spin polarization layer 130 may either be fixed or can rotate in a precessional manner as shown in FIG. 100. The magnetization 134 of the PSC layer 130 causes a spin torque on the free layer 104 that assists in moving its magnetization away from its quiescent state perpendicular to the plane of the free layer 104. This allows the magnetization 110 of the free layer 104 to more easily flip using less energy when applying a write current to the memory element 100.

As discussed above, precessional spin current from the PSC structure (which includes the PSC layer 130 and coupling layer 132) helps to boost the operational efficiency of the MRAM cell 100. This enhancement is achieved through magnetic coupling and spin transport between the MTJ free layer 104 and PCS structure 130, 132. To achieve optimal performance, this requires a balancing of the magnetizations between free layer 104 and the PSC layer 130. Magnetic properties, including the magnetization of the free layer 104 and magnetization of the PSC layer 130 are affected by the capping layer 122.

Previously, capping layers have been limited to material such as Ta. This has limited the amount by which capping layer can be used to effect and control magnetic properties of the PSC layer 130 and free layer 104. In addition, the use of Ta in a capping layer structure has led to process related damage to the magnetic memory element 100. As shown herein below, the use of novel materials in the capping layer structure 122 can provide a mechanism for accurately controlling magnetic properties of the PSC layer 130 and free layer 104 other than simply changing the thickness of a Ta capping layer. It also allows for control of effective magnetization of the PSC layer 134 by changing effective interface anisotropy fields without affecting its thickness or magnetic moment.

Figure 3:
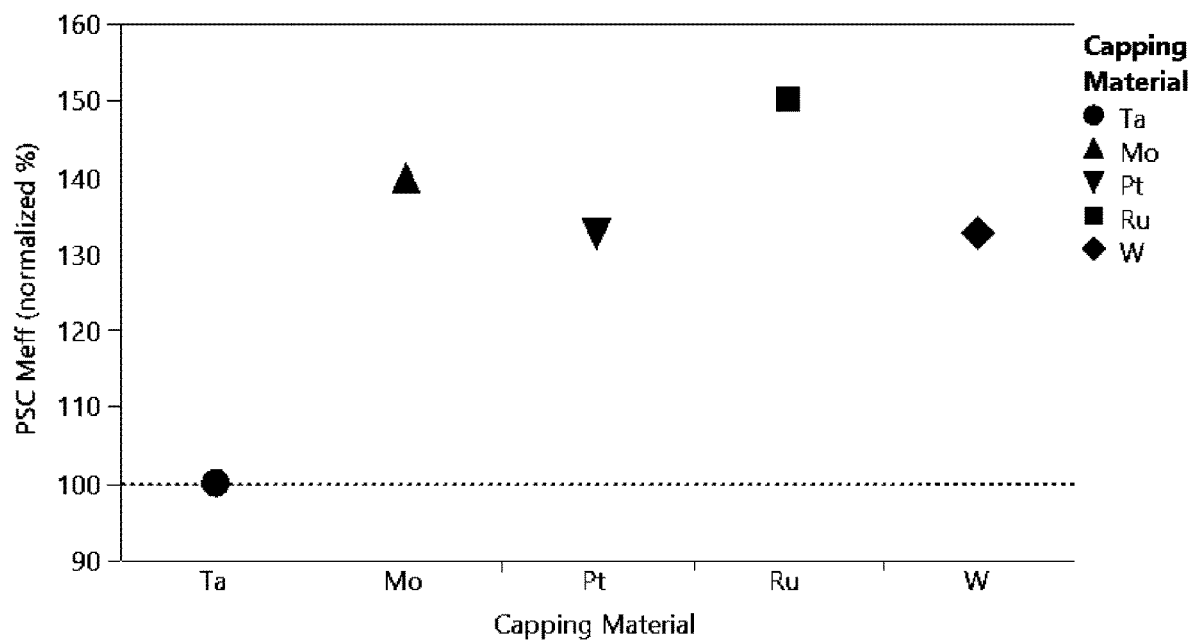
FIG. 3 is a graph showing magnetization PCS effective magnetization values for a plurality of capping materials.

Various materials for use in the capping layer 122 can provide several significant advantages over the use of a capping layer constructed of only Ta. For example, as shown in FIG. 3, capping layer materials including Mo, Pt, Ru and W provide a significantly higher effective magnetization ($M_{eff}$) of the PSC layer 130 as compared with that provided by Ta in a structure wherein all of the other elements of the memory element 100 remain the same. This means that the effectiveness of the PSC layer 130 in improving switching efficiency can be realized at smaller capping layer thickness than would be possible using a Ta capping layer structure. This means that capping layer material selection can be used to control and adjust PSC effective magnetization rather than capping layer thickness alone. When an optimal MTJ structure thickness and optimal capping layer thickness have been determined, in order to meet other design requirements, the selection of capping layer material (e.g. Mo, Pt, Ru or W) can be used to obtain the optimal effective magnetization of the PSC layer 122, either in the plane of the layer or at a canted angle relative to the plane of the PSC layer 122. The improved effective magnetization ($M_{eff}$) provided by the use of materials such as Mo, Pt, Ru or W in the capping layer (rather than Ta) can be the result of reduced dead layers in the surrounding layers which would otherwise result from the use of Ta and also may result from changes in interfacial magnetic anisotrotopy.

In addition to providing a mechanism for controlling effective magnetization of the PSC layer 122, the use of various materials other than Ta in the capping layer greatly reduces process related damage to the PSC layer 122 as well as other layers of the memory element 100. For example, the use of Mo, Pt, Ru or W in the capping layer 122 result in less process related oxidation during manufacturing. This results from the low electronegativity of Ta as compared with other materials such as Mo, Pt, Ru or W. For example, Ta has an electronegativity of only 1.5, whereas Mo has an electronegativity of 2.16, and W has an electronegativity of 2.36. The use of materials such as Mo, Pt, Ru or W also result in an increase in magnetoresistance, thereby improving the efficiency of the MTJ memory element 100.

Therefore, the capping layer 122 of FIG. 1, is formed of a transition metal and is preferably constructed of one or more of Zr, Mo, Ru, Rh, Pd, Hf, W, Ir, Pt and/or alloys and/or nitrides of these elements. The material choice and thickness can be chosen to ensure a desired effective magnetization in the underlying PSC layer 122.

Figure 2:
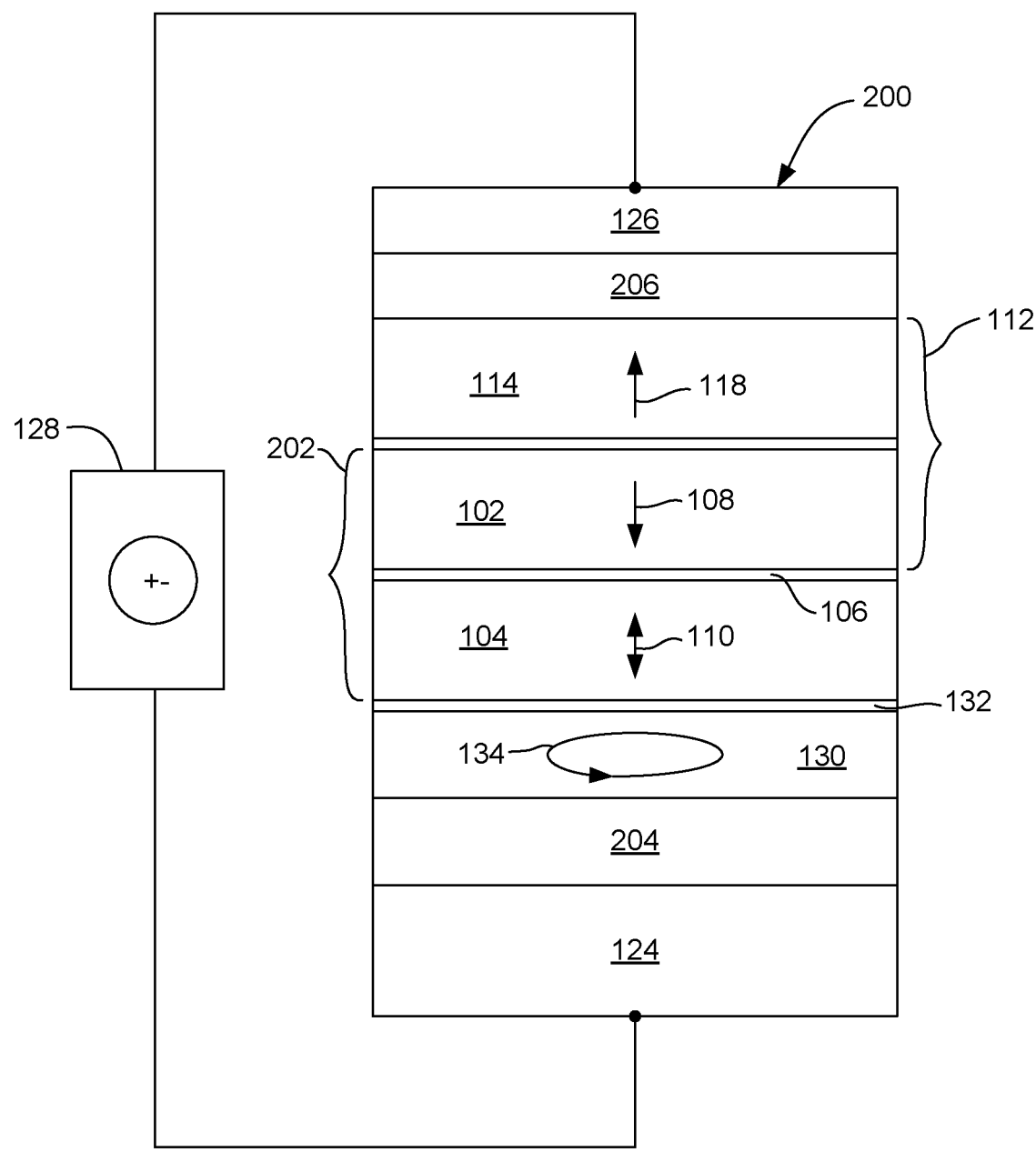
FIG. 2 is a schematic cross-sectional view of a magnetic memory element according to an alternate embodiment.

FIG. 2 shows a side, cross sectional view of a magnetic memory element 200 according to an alternate embodiment. The magnetic memory element 200 can be similar to the memory element 100 of FIG. 1, except that the order of layers is reversed. The memory element 200 of FIG. 2, includes an MTJ structure 202 wherein the magnetic free layer 104 is below the reference layer 102, with the non-magnetic barrier layer 106 being sandwiched between the reference layer 102 and free layer 104.

As with the previously discussed embodiment, the reference layer 102 can be a part of an antiferromagnetic structure 112 that includes the reference layer 102, a keeper layer (or pinned layer 114) and an antiferromagnetic exchange coupling layer 116 that is located between the reference layer 102 and the keeper layer 114. The keeper layer 114 can have a magnetization 118 oriented perpendicular to the plane of the layer 114, and antiferromagnetic coupling between the layers 102, 114 causes the reference layer 102 to have a magnetization 108 that is opposite to the magnetization 118 of the keeper layer 114. The coupling layer 116 can be constructed of a material such as Ru, having a thickness that is chosen to antiparallel exchange couple the magnetic reference and keeper layers 102, 114. The reference and keeper layers 102, 114 can be constructed of a magnetic material such as an alloy or multi-layers of Co and Fe.

A capping layer 206 can be provided at the top of the memory element structure 200 to protect the layers of the memory element structure during manufacture. The capping layer 206 can be a material such as Ta, and since the capping layer 206 is not located near the PSC layer 130, it need not be constructed of a material chosen to affect or control PSC magnetics. In addition, upper and lower electrically conductive leads 126, 124 can be provided at the top and bottom of the memory element structure 200 to provide electrical connection with circuitry 128 for reading a magnetic state of the memory element 200 and for switching the magnetic state of the memory element 200.

As discussed above, the magnetic free layer structure 104 is located beneath the reference layer structure 102 in the memory element structure embodiment 200. The Precessional Spin Current (PSC) layer 130 is located beneath the magnetic free layer and is separated from the magnetic free layer 104 by a spin coupling layer 132. As in the previously described embodiment, the PSC layer 130 is constructed of a magnetic material and is configured to have a magnetic anisotropy that is oriented in the plane of the layer 130. This results in the PSC layer 130 having a magnetization 134 that is oriented in the plane of the layer 130 or canted at an angle relative to the plane of the layer 130. The magnetization 134 can be fixed in this in plane or canted orientation or can oscillate in a precessional motion as indicated by the elliptical arrow shown in FIG. 2. The magnetization 134 of the PSC layer structure 130 advantageously reduces the energy required to switch the magnetization 110 of the free layer 104. As a result, less switching current is needed to switch the memory state of the memory element 200, resulting in improved energy efficiency and reduced thermal strain on the memory element 200.

The memory element 200 includes a seed layer 204 that is formed directly beneath and preferably in contact with the PSC layer 130. As with the capping layer 122 of FIG. 1, the seed layer 204 of FIG. 2 is a material layer that is constructed of a material composition and thickness that that is chosen to affect and control the effective magnetization (Meff) of the PSC layer 130. For example, the seed layer 204 can be constructed of a transition metal and is preferably constructed of one or more of Zr, Mo, Ru, Rh, Pd, Hf, W, Ir, Pt or alloys or nitrides of these elements.

As shown in the graph of FIG. 3, different materials adjacent to the PSC structure 130 can have different impacts on the effective magnetization ($M_{eff}$) of the PSC structure 130. In addition, the thickness of such an adjacent layer (e.g. the seed layer 204) can also affect the effective magnetization ($M_{eff}$) of the PSC layer 130. Therefore, the choice of material of the seed layer 204 (in addition to thickness of the seed layer 204) can be used as an additional mechanism (or "knob") for fine tuning the $M_{eff}$ of the PSC layer 130 to a desired magnetization.

While various embodiments have been described above, it should be understood that they have been presented by way of example only and not limitation. Other embodiments falling within the scope of the invention may also become apparent to those skilled in the art. Thus, the breadth and scope of the inventions should not be limited by any of the above-described exemplary embodiments but should be defined only in accordance with the following claims and their equivalents.

What is claimed is:

1. A magnetic memory element for use in a magnetic memory array, the magnetic memory element comprising:
    a magnetic tunnel junction structure including a magnetic free layer, a magnetic reference layer and a non-magnetic barrier layer located between the magnetic free layer and the magnetic reference layer;
    a precessional magnetic spin current layer located adjacent to the magnetic free layer;
    a coupling layer located between the precessional magnetic spin current layer and the magnetic free layer; and
    a material layer in contact with the precessional magnetic spin current layer, the material layer comprising one or more of Zr, Mo, Rh, Pd, Hf, W, Ir, Pt and/or alloys and/or nitrides of these elements and containing no Ta;
    wherein the coupling layer comprises Magnesium Oxide.

2. The magnetic memory element as in claim 1, wherein the magnetic free layer and the magnetic reference layer each have a perpendicular magnetic anisotropy and the precessional magnetic spin current layer has a substantially parallel magnetic anisotropy.

3. The magnetic memory element as in claim 1, wherein the coupling layer has a thickness of 0.3-1.5 nm.

4. A magnetic memory element for use in a magnetic memory array, the magnetic memory element comprising:
    a magnetic reference layer;
    a magnetic free layer;
    a non-magnetic barrier layer located between the magnetic reference layer and the magnetic free layer;
    a precessional magnetic spin current layer;
    a coupling layer located between the precessional magnetic spin current layer and the magnetic free layer; and
    a capping layer formed over and contacting the precessional magnetic spin current layer, the capping layer comprising one or more of Zr, Mo, Rh, Pd, Hf, W, Ir, Pt and/or alloys and/or nitrides of these elements and containing no Ta;
    wherein the coupling layer comprises Magnesium Oxide.

5. The magnetic memory element as in claim 4, wherein the magnetic reference layer and the magnetic free layer each have a perpendicular magnetic anisotropy and the precessional magnetic spin current layer has a substantially parallel magnetic anisotropy.

6. The magnetic memory element as in claim 4, wherein the coupling layer has a thickness of 0.3-1.5 nm.

7. A magnetic memory element for use in a magnetic memory array, the magnetic memory element comprising:
    a seed layer;
    a precessional magnetic spin current layer formed on and in contact with the seed layer;
    a magnetic free layer;
    a non-magnetic coupling layer located between the precessional magnetic spin current layer and the magnetic free layer;
    a magnetic reference layer; and
    a non-magnetic barrier layer located between the magnetic reference layer and the magnetic free layer;
    wherein the seed layer comprises one or more of Zr, Rh, Pd, Hf, Ir, Pt and/or alloys and/or nitrides of these elements and contains no Ta;
    wherein the coupling layer comprises Magnesium Oxide.

8. The magnetic memory element as in claim 7, wherein the magnetic free layer and magnetic reference layer each have a perpendicular magnetic anisotropy and the precessional magnetic spin current layer has a magnetic anisotropy with a primary component in a direction parallel a major surface of the magnetic free layer with the magnetic spin current layer.

9. The magnetic memory element as in claim 7, wherein the coupling layer has a thickness of 0.3-1.5 nm.

* * * * *